United States Patent
Sun et al.

(10) Patent No.: US 9,823,121 B2
(45) Date of Patent: Nov. 21, 2017

(54) METHOD AND SYSTEM FOR MEASURING RADIATION AND TEMPERATURE EXPOSURE OF WAFERS ALONG A FABRICATION PROCESS LINE

(71) Applicant: KLA-Tencor Corporation, Milpitas, CA (US)

(72) Inventors: Mei Sun, Milpitas, CA (US); Earl Jensen, Milpitas, CA (US); Kevin O'Brien, Menlo Park, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 20 days.

(21) Appl. No.: 14/880,899

(22) Filed: Oct. 12, 2015

(65) Prior Publication Data

US 2016/0138969 A1    May 19, 2016

Related U.S. Application Data

(60) Provisional application No. 62/063,657, filed on Oct. 14, 2014.

(51) Int. Cl.
*G01J 5/10* (2006.01)
*G01J 1/42* (2006.01)
(Continued)

(52) U.S. Cl.
CPC ............. *G01J 1/429* (2013.01); *G01J 1/0204* (2013.01); *G01J 1/0271* (2013.01);
(Continued)

(58) Field of Classification Search
CPC ............. H01L 31/12; H01L 21/67253; G01B 11/0625; G01B 11/0641; G01B 11/3675;
(Continued)

(56) References Cited

U.S. PATENT DOCUMENTS

| | | |
|---|---|---|
| 4,459,044 A | 7/1984 | Alves |
| 4,560,286 A | 12/1985 | Wickersheim |

(Continued)

OTHER PUBLICATIONS

Ashiq Hussain Khalid et al., Thermographic Phosphors for High Temperature Measurements: Principles, Current State of the Art and Recent Applications, Sensors, vol. 8, pp. 5673-5744, Sep. 15, 2008.

(Continued)

*Primary Examiner* — Marcus Taningco
*Assistant Examiner* — Faye Boosalis
(74) *Attorney, Agent, or Firm* — Suiter Swantz pc llo

(57) ABSTRACT

A measurement wafer device for measuring radiation intensity and temperature includes a wafer assembly including one or more cavities. The measurement wafer device further includes a detector assembly. The detector assembly is disposed within the one or more cavities of the wafer assembly. The detector assembly includes one or more light sensors. The detector assembly is further configured to perform a direct or indirect measurement of the intensity of ultraviolet light incident on a surface of the wafer assembly. The detector assembly is further configured to determine a temperature of one or more portions of the wafer assembly based on one or more characteristics of the one or more light sensors.

52 Claims, 10 Drawing Sheets

(51) Int. Cl.
  *G01J 1/58* (2006.01)
  *H01L 21/67* (2006.01)
  *G01J 1/02* (2006.01)
  *G01J 1/04* (2006.01)
  *G01J 5/04* (2006.01)
  *G01J 5/08* (2006.01)
  *H01L 21/66* (2006.01)

(52) U.S. Cl.
  CPC ............... *G01J 1/0407* (2013.01); *G01J 1/58* (2013.01); *G01J 5/04* (2013.01); *G01J 5/0818* (2013.01); *G01J 5/10* (2013.01); *H01L 21/67248* (2013.01); *H01L 21/67253* (2013.01); *H01L 22/10* (2013.01)

(58) Field of Classification Search
  CPC .. G01J 1/429; G01J 1/6204; G01J 5/10; G01J 1/58
  See application file for complete search history.

(56) References Cited

U.S. PATENT DOCUMENTS

| | | |
|---|---|---|
| 5,414,266 A | 5/1995 | Sun |
| 5,470,155 A | 11/1995 | Jensen |
| 2004/0098216 A1 | 5/2004 | Ye et al. |
| 2005/0127835 A1 | 6/2005 | Cole et al. |
| 2007/0099327 A1 | 5/2007 | Hartzell et al. |
| 2010/0187441 A1 | 7/2010 | Waldbeser et al. |
| 2013/0155390 A1 | 6/2013 | Jensen et al. |
| 2014/0231635 A1* | 8/2014 | Kerness ................ G01S 17/026 250/226 |

OTHER PUBLICATIONS

PCT International Search Report for PCT/US2015/055307 dated Jan. 26, 2016, 4 pages.

* cited by examiner

METHOD AND SYSTEM FOR MEASURING RADIATION AND TEMPERATURE EXPOSURE OF WAFERS ALONG A FABRICATION PROCESS LINE

CROSS-REFERENCE TO RELATED APPLICATION

The present application is related to and claims the benefit of the earliest available effective filing date(s) from the following listed application(s) (the "Related Applications") (e.g., claims earliest available priority dates for other than provisional patent applications or claims benefits under 35 USC §119(e) for provisional patent applications, for any and all parent, grandparent, great-grandparent, etc. applications of the Related Application(s)).

RELATED APPLICATIONS

For purposes of the USPTO extra-statutory requirements, the present application constitutes a regular (non-provisional) patent application of United States Provisional Patent Application entitled WIRELESS UV AND TEMPERATURE SENSING DEVICE FOR HIGH TEMPERATURE PROCESS, naming Mei Sun, Earl Jensen and Kevin O'Brien as inventors, filed Oct. 14, 2014, Application Ser. No. 62/063,657.

TECHNICAL FIELD

The present invention generally relates to radiation and temperature monitoring of wafers along a semiconductor process line, and, in particular, to monitoring ultraviolet (UV) light and temperature exposure of wafers in process settings involving UV light exposure.

BACKGROUND

As tolerances on process conditions in semiconductor device processing environments continue to narrow, the demand for improved process monitoring systems continues to increase. Ultraviolet (UV) radiation uniformity within a processing system (e.g., low K thin film curing system) is one such condition. Current methods are unable to simultaneously monitor both UV radiation intensity and temperature in under the extreme conditions (e.g., high temperature and short wavelength) required of current processing techniques. Therefore, it would be desirable to provide a system and method to enhance measurement sensitivity of radiation and temperature across a test wafer used in monitoring the conditions of a given semiconductor device processing line.

SUMMARY

A measurement wafer apparatus for measuring radiation intensity and/or temperature is disclosed, in accordance with an illustrative embodiment of the present disclosure. In one embodiment, the measurement wafer apparatus includes a wafer assembly including one or more cavities. In another embodiment, the measurement wafer apparatus includes a detector assembly. In one embodiment, at least a portion of the detector assembly is disposed within the one or more cavities of the wafer assembly. In another embodiment, the detector assembly includes one or more light sensors. In another embodiment, the detector assembly is configured to perform at least one of a direct measurement of the intensity of ultraviolet light incident on at least one surface of the wafer assembly or an indirect measurement of the intensity of ultraviolet light incident on the at least one surface of the wafer assembly. In another embodiment, the detector assembly is further configured to determine a temperature of one or more portions of the wafer assembly based on one or more characteristics of the one or more light sensors upon measuring the intensity of the ultraviolet light incident on the at least one surface of the wafer assembly.

A measurement wafer apparatus for measuring radiation intensity and/or temperature is disclosed, in accordance with an illustrative embodiment of the present disclosure. In one embodiment, the wafer apparatus includes a wafer assembly including one or more cavities. In another embodiment, the wafer apparatus includes a detector assembly. In another embodiment, at least a portion of the detector assembly is disposed within the one or more cavities of the wafer assembly. In another embodiment, the detector assembly includes one or more light sensors. In another embodiment, the detector assembly is configured to perform at least one of a direct measurement of the intensity of ultraviolet light incident on at least one surface of the wafer assembly or an indirect measurement of the intensity of ultraviolet light incident on the at least one surface of the wafer assembly. In another embodiment, the detector assembly is further configured to determine a temperature of one or more portions of the wafer assembly based on at least one of one or more characteristics of the one or more light sensors or one or more temperature measurements from one or more temperature sensors disposed at least proximate to the one or more light sensors.

A measurement wafer apparatus for measuring radiation intensity and/or temperature is disclosed, in accordance with another illustrative embodiment of the present disclosure. In one embodiment, the measurement wafer apparatus includes a substrate and a cover operably coupled to a portion of the substrate. In another embodiment, the measurement wafer apparatus includes one or more cavities formed between the substrate and the cover. In another embodiment, the measurement wafer apparatus includes one or more light sensors disposed within the one or more cavities. In another embodiment, the cover includes one or more windows for passing light to the one or more light sensors from a top surface of the cover. In another embodiment, the one or more light sensors are configured to measure the intensity of light passed through the one or more windows. In another embodiment, the measurement wafer apparatus includes one or more local controllers communicatively coupled to the one or more light sensors. In another embodiment, the one or more local controllers are configured to receive one or more signals indicative of the intensity of light measured by the one or more light sensors. In another embodiment, the measurement wafer apparatus includes one or more central controllers communicatively coupled to the one or more local controllers and configured to determine the temperature of the one or more light sensors based on a decay feature of the intensity of light measured by the one or more light sensors.

A measurement wafer apparatus for measuring radiation intensity and/or temperature is disclosed, in accordance with an illustrative embodiment of the present disclosure. In one embodiment, the measurement wafer apparatus includes a substrate and a cover operably coupled to a portion of the substrate. In another embodiment, measurement wafer apparatus includes one or more light sensors disposed within one or more cavities formed between the substrate and the cover. In another embodiment, measurement wafer apparatus includes one or more photoluminescent elements disposed within the one or more cavities. In another embodiment, the cover includes one or more windows for passing light to the one or more photoluminescent elements from a top surface of the cover. In another embodiment, the one or more photoluminescent elements are configured to absorb at least a portion of light of a first wavelength range passed through the one or more windows and emit light of at least a second wavelength range different from the first wavelength range. In another embodiment, the one or more light sensors are configured to measure the intensity of light of the at least a second wavelength range emitted by the one or more photoluminescent elements. In another embodiment, measurement wafer apparatus includes one or more light guiding elements disposed within the one or more cavities, wherein the one or more light guiding elements are configured to transmit light of the at least a second wavelength range from the one or more photoluminescence elements to the one or more light sensors.

In another embodiment, measurement wafer apparatus includes one or more local controllers communicatively coupled to the one or more light sensors, the one or more local controllers configured receive one or more signals indicative of the intensity of the light of the at least a second wavelength range measured by the one or more light sensors. In another embodiment, measurement wafer apparatus includes one or more central controllers communicatively coupled to the one or more local controllers, the one or more central controllers configured to determine the temperature of the one or more photoluminescent elements based on an intensity feature of the intensity of the light of the at least a second wavelength range measured by the one or more light sensors.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Reference will now be made in detail to the subject matter disclosed, which is illustrated in the accompanying drawings.

Figure 1A:
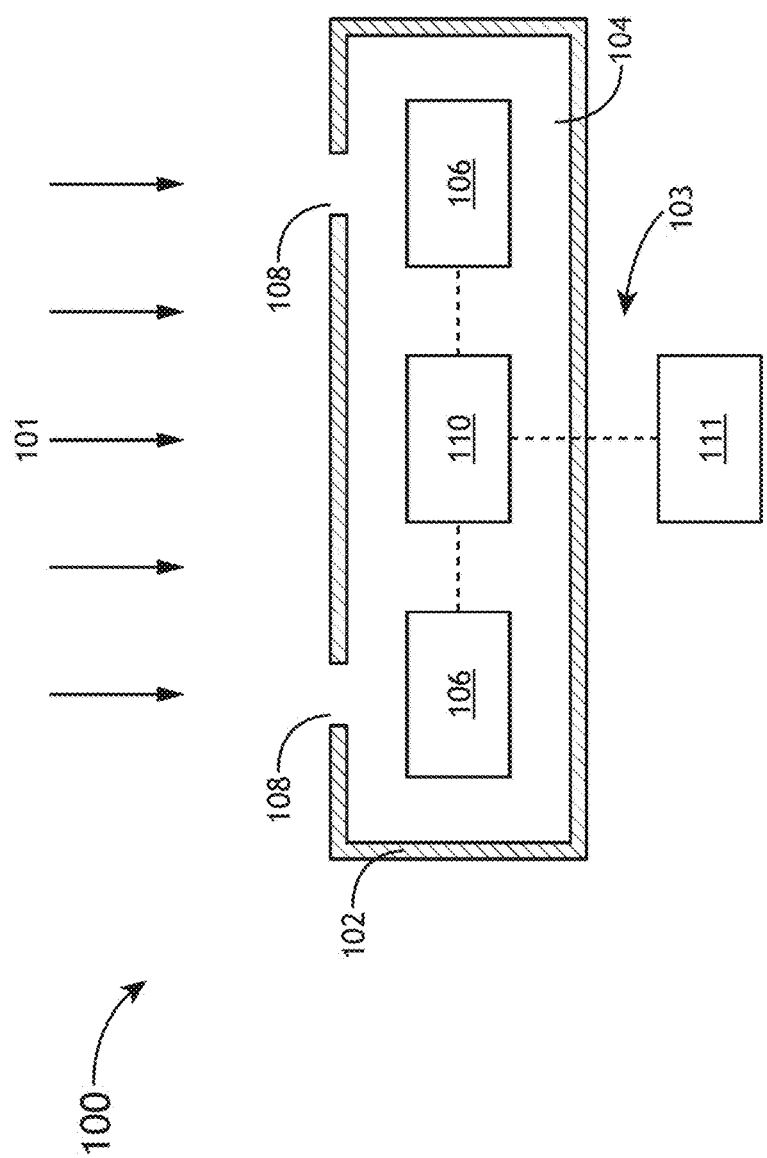
FIG. 1A is a conceptual view illustrating a measurement wafer for measuring light intensity and temperature, in accordance with one embodiment of the present disclosure.
Figure 1B:
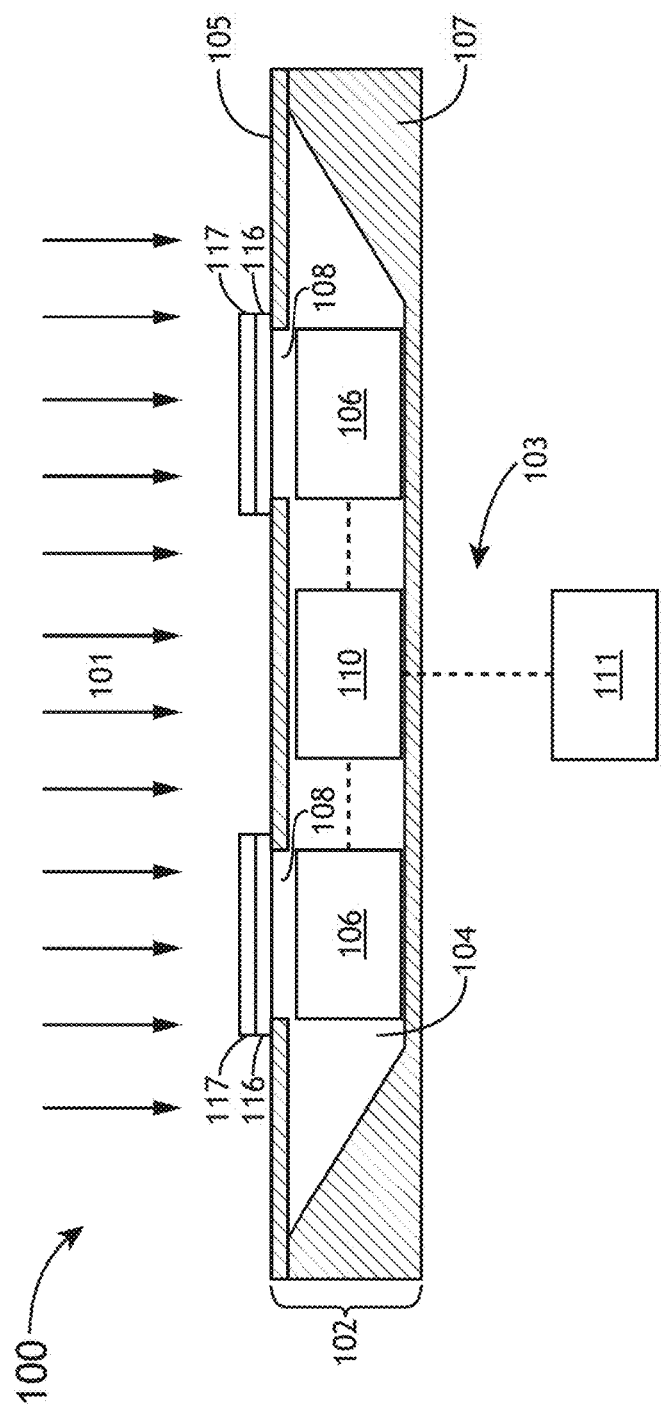
FIG. 1B is a simplified cross-sectional view illustrating a measurement wafer for the direct measurement of light intensity, in accordance with one embodiment of the present disclosure.
Figure 1C:
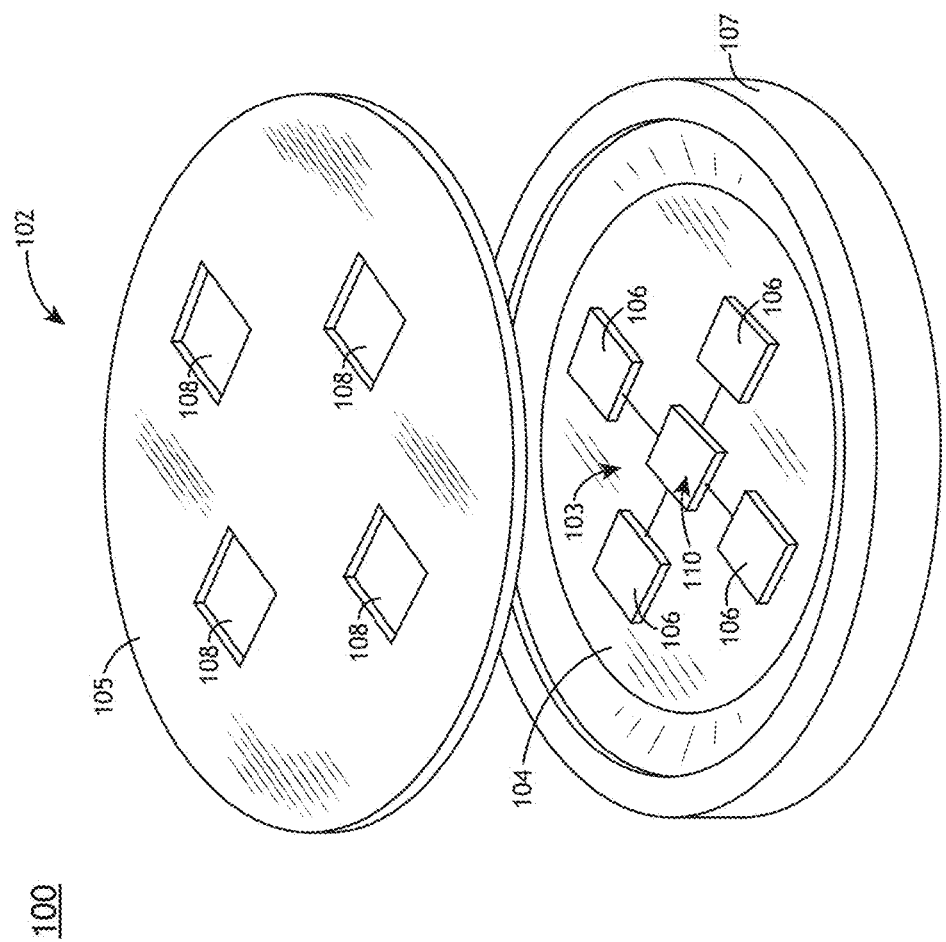
FIG. 1C is an assembly view illustrating a measurement wafer for the direct measurement of light intensity, in accordance with one embodiment of the present disclosure.
Figure 1D:
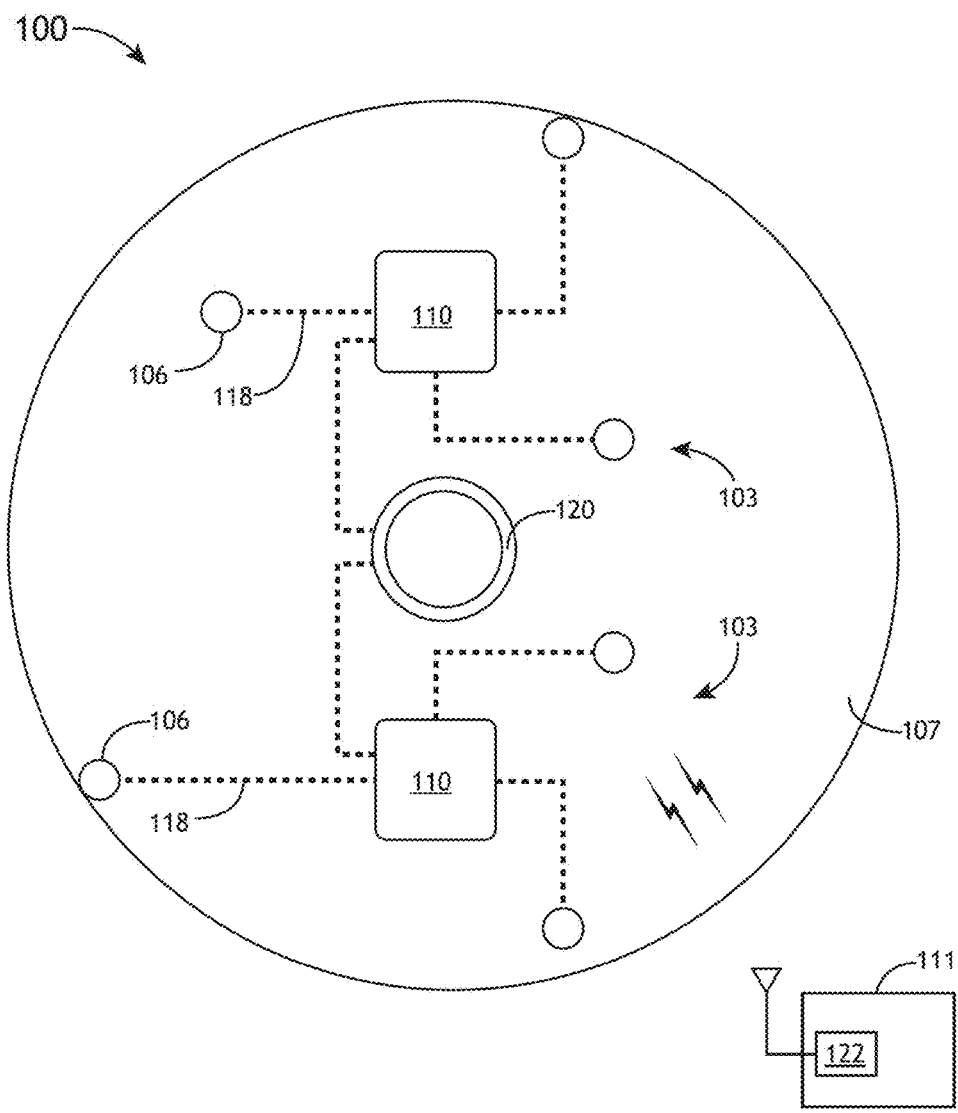
FIG. 1D is a simplified top view illustrating a substrate of the measurement wafer (cover not shown for clarity) including sensors and local controllers, in accordance with one embodiment of the present disclosure.
Figure 1E:
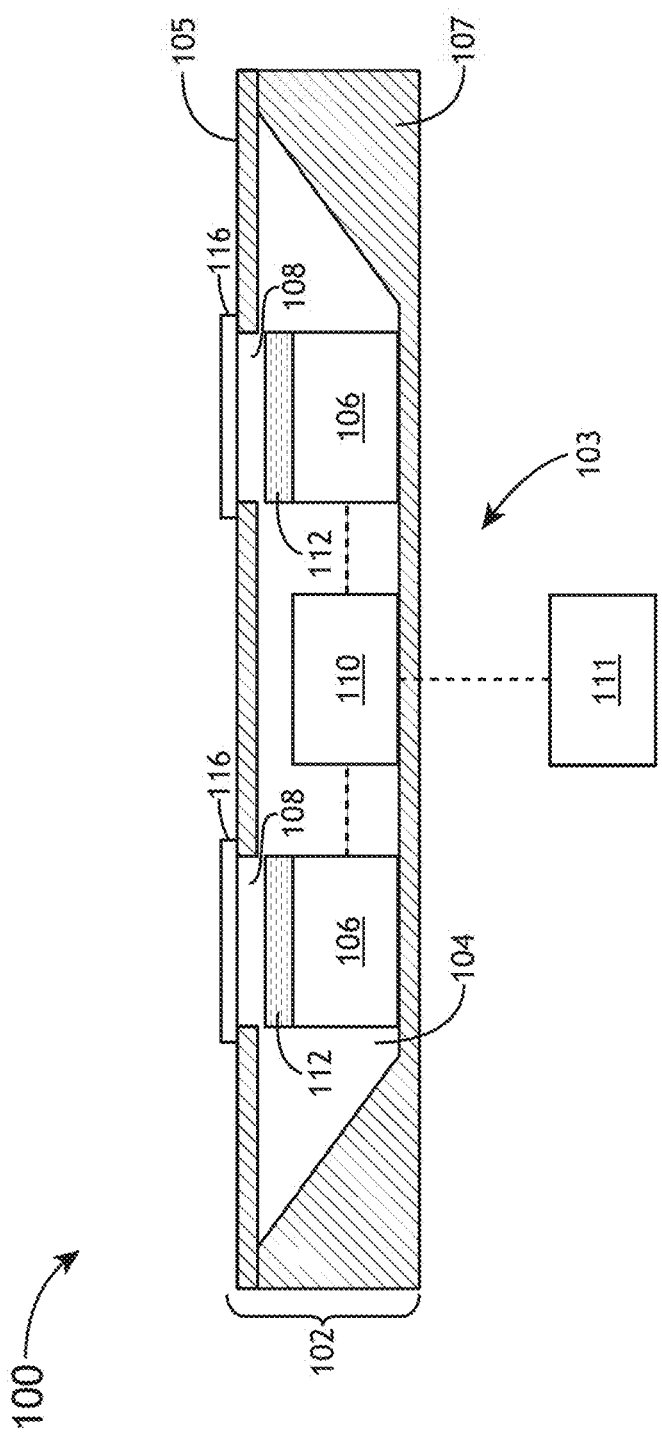
FIG. 1E is a simplified cross-sectional view illustrating a measurement wafer for the indirect measurement of light intensity including photoluminescent elements, in accordance with one embodiment of the present disclosure.
Figure 1F:
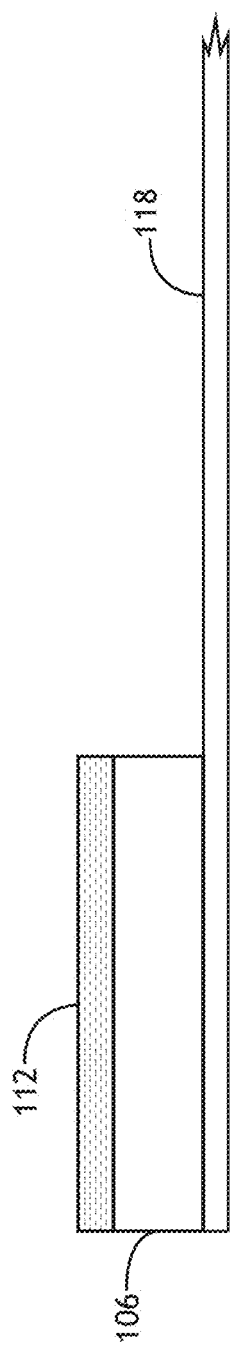
FIG. 1F is a simplified cross-sectional view illustrating a photoluminescent element and sensor stack, in accordance with one embodiment of the present disclosure.
Figure 1G:
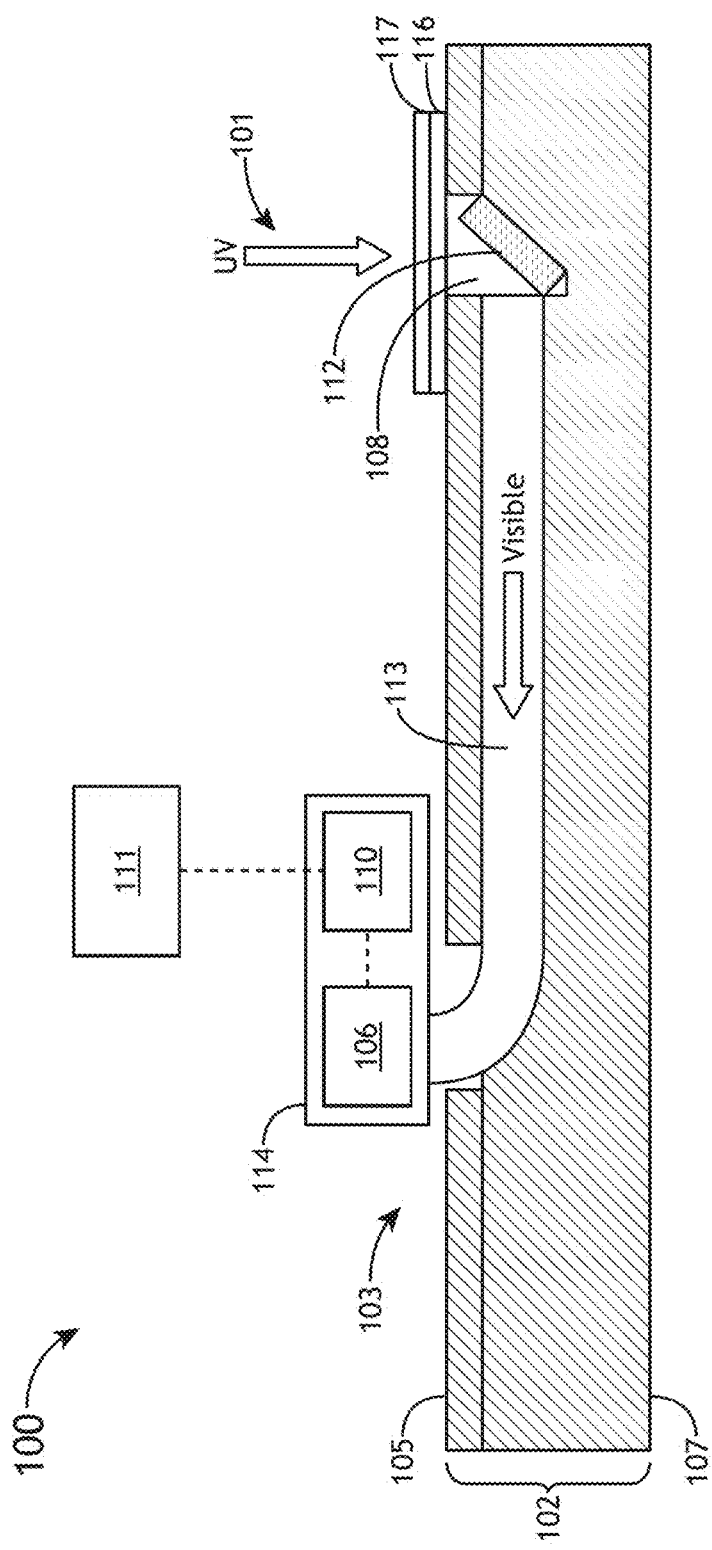
FIG. 1G is a simplified cross-sectional view illustrating a measurement wafer for indirect measurement of light intensity including photoluminescent elements and a light guide element and the thermal isolation of a sensor module from the substrate, in accordance with one embodiment of the present disclosure.
Figure 1H:
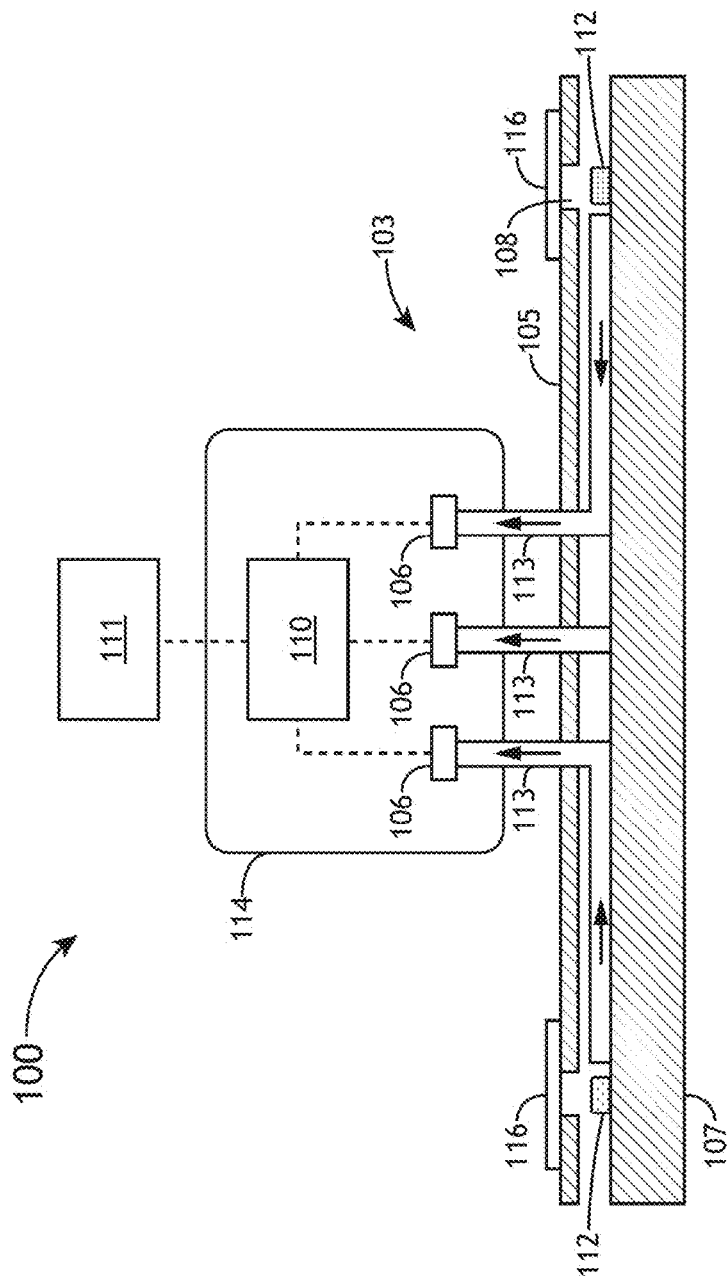
FIG. 1H is a simplified cross-sectional view illustrating a measurement wafer for indirect measurement of light intensity including photoluminescent elements and a light guide element and the thermal isolation of a sensor module from the substrate, in accordance with one embodiment of the present disclosure.
Figure 1I:
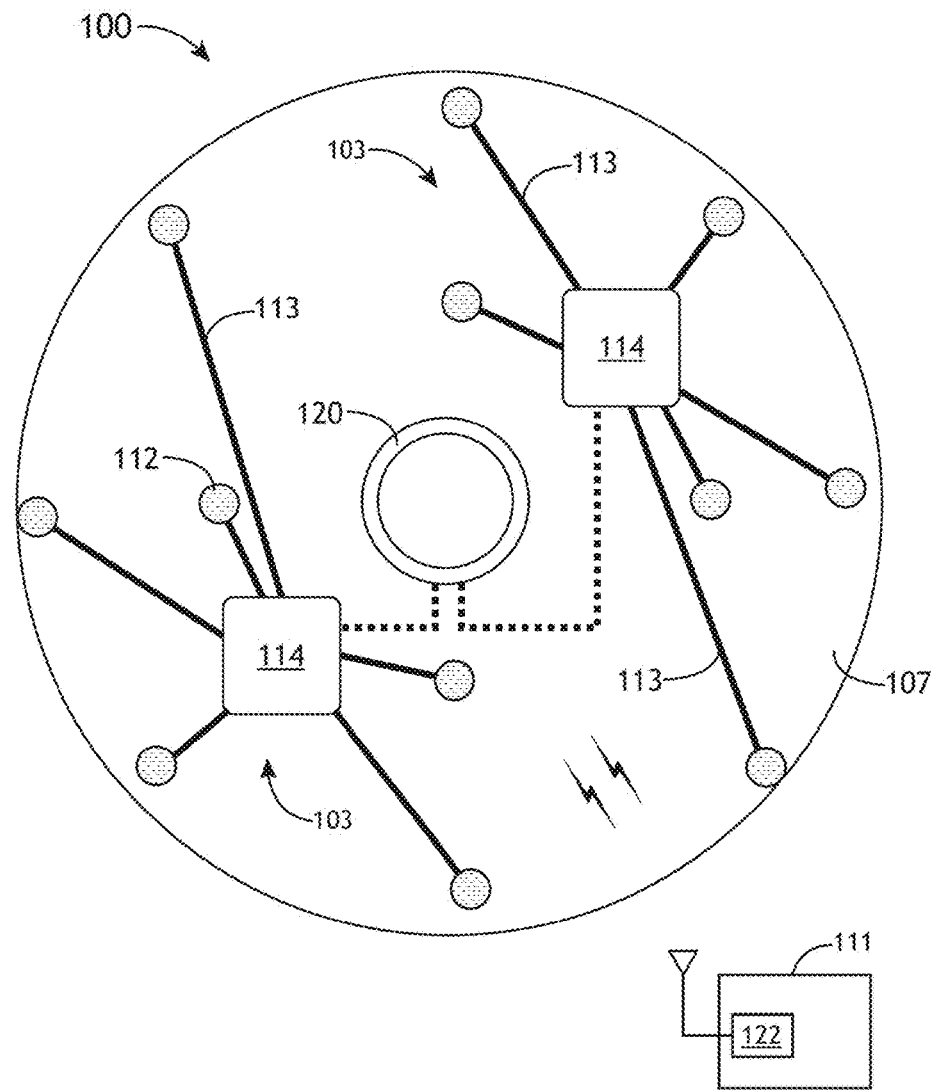
FIG. 1I is a simplified top view illustrating a substrate of the measurement wafer (cover not shown for clarity) for indirect measurement of light intensity including photoluminescent elements, light guides and sensor modules, in accordance with one embodiment of the present disclosure.
Figure 2:
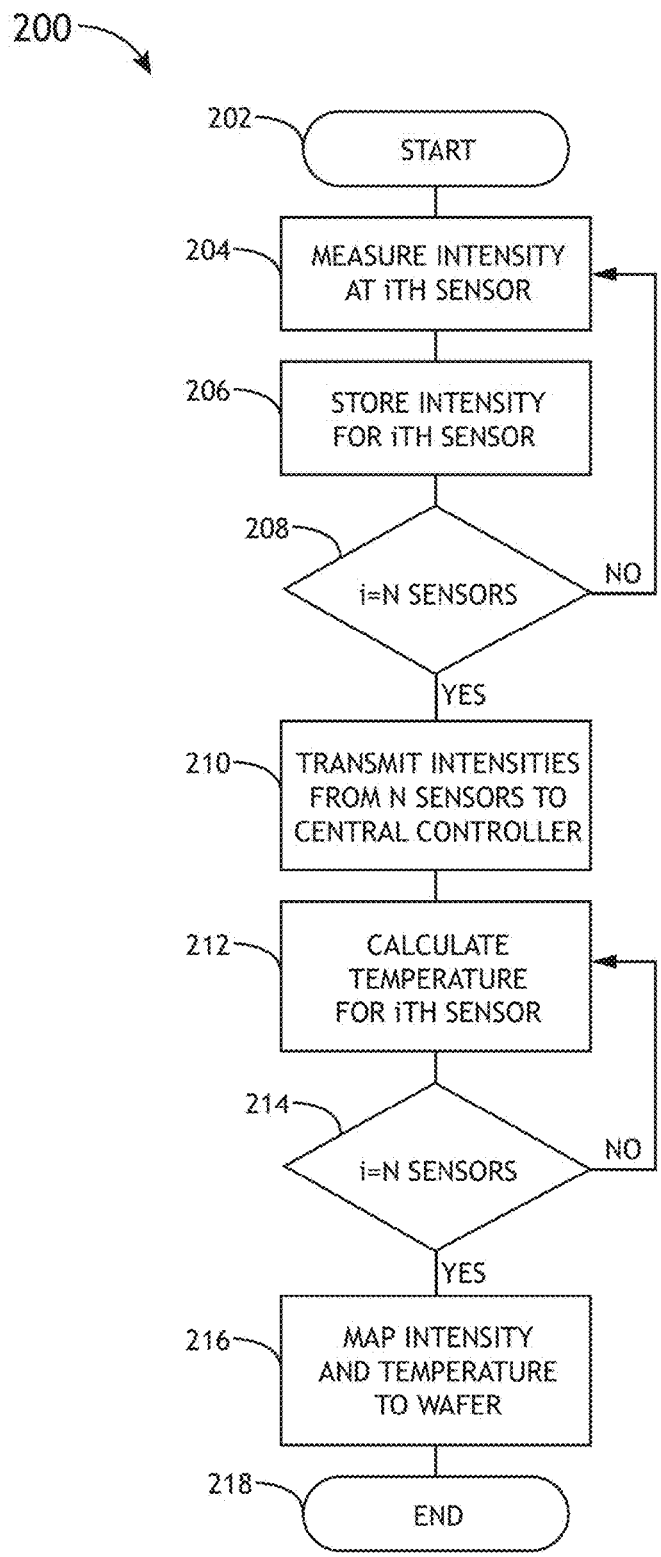
FIG. 2 is a flowchart depicting the operation of the measurement wafer apparatus for measuring radiation intensity and temperature across the measurement wafer, in accordance with one embodiment of the present disclosure.

Referring generally to FIGS. 1A through 2, a system and method for measuring radiation intensity and/or temperature are described in accordance with the present disclosure.

FIG. 1A illustrates a conceptual view of a cross-section of the measurement wafer device 100 for measuring radiation and/or temperature at one or more locations across the wafer device, in accordance with one or more embodiments of the present disclosure.

In one embodiment, the wafer measurement device 100 includes a wafer assembly 102. In another embodiment, the wafer assembly 102 includes one or more cavities 104. The one or more cavities 104 may be formed by any process known in the art of semiconductor fabrication (e.g., grinding, chemical etching, laser etching and the like). In another embodiment, the wafer measurement device 100 includes detector assembly 103 disposed within the cavity 104 of the wafer assembly 102. It is noted herein that the present disclosure is not limited to a wafer assembly 102 including one or more cavities 104. For example, the detector assembly 103 (or portions thereof) need not be disposed within a cavity 104, but may be disposed on any surface (e.g., top surface, bottom surface or edge) of the wafer assembly 102.

In one embodiment, the detector assembly 103 includes one or more light sensors 106. The one or more light sensors 106 may include any light sensor known in the art. For example, the one or more light sensors 106 may include, but are not limited to, a light sensor capable of sensing UV and/or visible light.

In one embodiment, the detector assembly 103 is configured to perform a direct measurement of the intensity of ultraviolet light incident on at least one surface of the wafer assembly 102. In the case of direct detection of UV light from the process environment above the measurement device 100, the one or more light sensors 106 may include, but are not limited to, one or more light sensors sensitive to at least UV light (e.g., silicon carbide based sensor). For instance, the light sensors 106 may include, but are not limited to, light sensors sensitive to UV light in the wavelength range of 150-400 nm.

In another embodiment, the detector assembly 103 is configured to perform an indirect measurement of the intensity of ultraviolet light incident on the at least one surface of the wafer assembly 102. In the case of indirect detection of UV light (e.g., detection via intermediate photoluminescent emission from photoluminescent element) from the process environment above the measurement device 100, the one or more light sensors 106 may include, but are not limited to, one or more light sensors sensitive to at least visible light (e.g., silicon based sensor). For instance, the light sensors may include, but are not limited to, light sensors 106 sensitive to visible light in the wavelength range of 450-750 nm.

For the purposes of the present disclosure an "indirect measurement" is interpreted as a measurement of light intensity involving an intermediate conversion of a light signal from a first wavelength/wavelength range to a second wavelength/wavelength range, such as, but not limited to, photoluminescence conversion of UV light to visible light. Further, the term "direct measurement" is interpreted as a measurement of light intensity not involved an intermediate conversion of a light signal. It is noted that embodiments associated with direct intensity measurement (FIGS. 1B-1D) and embodiments associated with indirect intensity measurement (FIGS. 1E-1E) are described in additional detail further herein.

In one embodiment, the one or more light sensors 106 include one or more diode detectors. For example, the one or more light sensors 106 may include, but are not limited to, one or more silicon carbide (SiC) diode detectors, one or more gallium nitride (GaN) diode detectors, one or more aluminum gallium nitride (AlGaN) detectors or one or more silicon diode detectors.

In another embodiment, the wafer assembly 102 includes one or more openings 108. In one embodiment, the one or more openings 108 are formed at the top surface of the wafer assembly 102 so as to allow ultraviolet light 101 incident on the top surface of the wafer assembly 102 to the one or more light sensors 106. In this regard, the one or more openings 108 may be distributed across the top surface of the wafer assembly so as to allow for the selected measurement of intensity and/or temperature across the surface of the wafer assembly 102.

In another embodiment, the detector assembly 103 of the wafer measurement device 100 includes a local controller 110. In one embodiment, the local controller 110 is communicatively coupled to the one or more light sensors 106. For example, the local controller 110 may receive one or more signals from the one or more sensors 106 indicative of the intensity of light measured by the one or more light sensors 106 or one or more additional characteristics of the one or more light sensors 106. For instance, the local controller 110 may receive one or more signals from the one or more light sensors 106 indicative of the intensity of the light (e.g., UV or visible light) measured by the one or more light sensors 106. Further, the local controller 110 may receive one or more signals from the one or more light sensors 106 indicative of one or more electrical characteristics (e.g., voltage output) of the one or more light sensors 106. In another embodiment, the device 100 may, but is not required to, monitor the temperature of the wafer assembly 102 at the one or more light sensors 106 by measuring one or more electrical characteristics (e.g., forward voltage) of the one or more sensors 106. In another embodiment, the detector assembly 103 includes one or more temperature sensors (e.g., thermal probes). The thermal probes may be disposed proximate to the one or more light sensors 106, with the output of the thermal probes being coupled to the one or more local controllers 110. In this sense, temperature across the wafer assembly 102 may be measured via the decay of PL emission intensity measured by light sensors 106 (indirect measurement case), via one or more electrical characteristics of the light sensors 106 (direct measurement case), or via a dedicated temperature probe (direct measurement or indirect measurement cases).

In another embodiment, the detector assembly 103 of the wafer measurement device 100 includes a central controller 111. In one embodiment, the central controller 111 is configured to determine a temperature of one or more portions of the wafer assembly 102 based on one or more characteristics of the one or more sensors 106 (e.g., a characteristic of the intensity of the PL emission incident or an electrical characteristic of the one or more sensors 106).

For example, the central controller 111 may determine a temperature of one or more portions of the wafer assembly 102 based on an electrical characteristic (e.g., forward voltage across a given sensor 106 at a known current) measured at the one or more light sensors 106. By way of another example, the central controller 111 may determine a temperature of one or more portions of the wafer assembly 102 based on a measured intensity characteristic (e.g., light intensity values at different excitation wavelengths or intensity decay time—in the case of intermediate PL elements) from the one or more sensors 106. Then, based on the measured electrical characteristics or intensity characteristics from the one or more light sensors 106 or the temperature measurement from the dedicated temperature sensors one or more temperature values may be determined. In this regard, the UV intensity and/or the calculated temperature may be mapped to the wafer device position based on the position of the light sensor 106 (or the position of the PL element, in the case of indirect conversion). Applying this procedure for each of the light sensors 106 distributed across the wafer assembly 102 a 2D intensity and/or temperature map may be generated by the detector assembly 103 (e.g., generated by the central controller 111).

It is noted herein that device 100 is not limited to measurement contexts that include both intensity and temperature. For example, the device 100 may be configured to measure intensity of light alone, temperature exposure alone or intensity and temperature.

In one embodiment, the local controller 110 and/or the central controller 111 include one or more processors (not shown). In another embodiment, the one or more processors are configured to execute a set of program instructions configured to cause the one or more processors to carry out one or more of the various steps described throughout the present disclosure. In another embodiment, the controller 110 may include a non-transitory medium (e.g., memory medium) for storing the program instructions and the intensity measurement results received from the one or more sensors 106. For the purposes of the present disclosure, the term 'processor' may be broadly defined to encompass any device having one or more processors (e.g., CPU) or logic elements (e.g., ASICs), which execute instructions from a memory medium. In this sense, the one or more processors of local controller 110 and/or central controller 111 may include any microprocessor-type or logic device configured to execute algorithms and/or instructions. It should be recognized that the steps described throughout the present disclosure may be carried out by a single processor or, alternatively, multiple processors. The memory medium may include a read-only memory, a random access memory, a magnetic or optical disk, a solid state drive, flash, EPROM, EEPROM, a magnetic tape or the like.

FIGS. 1B-1E illustrate simplified cross-sectional, assembly and top views of the measurement wafer device 100 for measuring radiation intensity and temperature via direct light intensity measurement, in accordance with one or more embodiments of the present disclosure. It is noted herein that the description of the components and embodiments illustrated in FIG. 1A should be interpreted to extend to FIGS. 1B-1E unless noted otherwise.

In one embodiment, the wafer assembly 102 of the measurement wafer device 100 includes one or more structures. In one embodiment, the one or more light sensors 106 are disposed within the one or more structures of the measurement wafer device 100. For example, structures of the measurement wafer device 100 may be arranged and/or formed so as to form the one or more cavities 104. In another embodiment, the wafer assembly 102 may fit within a thin form factor package. It is noted herein that the wafer assembly 102 is designed to mimic a wafer typically used in a processing environment within the semiconductor industry (e.g., plasma processing device) in order to provide insight as to the intensity of UV light and temperature exposure of a wafer undergoing the conditions in the given processing environment.

In one embodiment, the wafer assembly 102 includes a substrate 107 (e.g., substrate wafer). The substrate may be formed from any material known in the art compatible with semiconductor device processing steps. For example, substrate 107 may include, but is not limited to, a semiconductor substrate, a glass substrate and the like. In another embodiment, the measurement wafer device 100 includes a cover 105 (e.g., cover wafer). For example, as shown in FIGS. 1B and 1C, the cover 105 may be attachable to the top surface of the substrate 107.

In another embodiment, the one or more cavities 104 of the wafer assembly 102 are formed between the substrate 107 and cover 105. For example, the substrate 107 may include a recessed portion, as shown in FIGS. 1B and 1C. In this regard, upon attachment of the cover 105 to the top surface of the substrate 105, the recessed portion of the substrate 107 and the cover 105 may form one or more cavities 104 within the wafer assembly 102.

The one or more cavities 104 of the wafer assembly 102 may be formed by any processing procedure known in the art. For example, the process used to form the cavity 104 may include, but is not limited to, a mechanical grinding process, an etching process or a laser machining process performed on the substrate to form one or more recessed portions in the substrate 107.

In one embodiment, the cavity 104 may have a substantially truncated conical shape, as shown in FIGS. 1B and 1C. It is noted herein that the shape depicted in FIGS. 1B and 1C is not limiting and is provided merely for illustrative purposes. It is noted herein that the cavity 104 depicted in FIGS. 1B and 1C is not a limitation on the present disclosure and is provided merely for illustrative purposes. The cavity 104 may take on any shape known in the art. For example, the cavity 104 may have a shape including, but not limited to, a truncated conic section, a cuboid, a cylinder (e.g., shallow cylinder), a prism (e.g., triangular prism, a hexagonal prism and the like) and similar shapes. Further, the wafer assembly 102 may include any cavity arrangement or number of cavities suitable for housing the various components (e.g., light sensor(s) 106, controller 110 and the like) within the wafer assembly 102.

In another embodiment, one or more openings 108 are formed in the cover 105. In this regard, one or more openings 108 are arranged so as to transmit light (e.g., UV light) from the top surface of the cover 105 to one or more sensors 106 situated below the top cover 105. In one embodiment, the one or more openings 108 may be distributed across the top surface of the wafer assembly so as to allow for the selected measurement of intensity, temperature across the surface of the wafer assembly 102. Similarly, in the case of direct intensity measurement, the light sensors 106 may be arranged so a light sensor 106 is positioned proximate to each of the openings 108, creating a network of light sensors 106 distributed across the wafer assembly 102, thereby allowing for the analysis of intensity, temperature uniformity across the wafer assembly 102.

In another embodiment, the wafer assembly 102 includes one or more windows 116. The one or more windows 116 are positioned above, below or within the one or more openings 108. In another embodiment, the wafer assembly 102 includes one or more entrance filters 117. In one embodiment, the one or more entrance filters 117 are disposed proximate to the one or more windows 116 and are configured to block a portion of light 101 incident on the surface of the wafer assembly 102. For example, in cases where the light of interests includes UV light, the one or more entrance filters 117 may be selected so as to block visible light or IR light to avoid false positives at the one or more light sensors 106.

It is noted that the use of one or more windows 116 at the openings 108 serves to protect the one or more sensors 106 (and other electronics) within the wafer assembly 102 from the harsh conditions associated with the processing environment above the wafer assembly 102. In addition, the one or more windows 116 may serve as support structures for supporting thin film filters (e.g., dielectric filter).

As noted previously herein, the one or more light sensors 106 may include one or more diode detectors. In the case of direct measurement of UV light intensity, it is further noted that diode detectors sensitive to UV are particularly useful. While the diode detectors of this embodiment are not limited to any particular type of diode detectors, diode detectors, such as, but not limited to, SiC and GaN display UV light and display sensitivity features suitable for use in the direct measurement of UV light.

In one embodiment, the local controller 110 receives one or more signals from one or more light sensors 106 indicative of the intensity of UV light measured by the one or more light sensors 106. Further, the local controller 110 receives one or more signals from one or more light sensors 106 indicative of one or more electrical characteristics of one or more light sensors 106. In turn, the central controller 111 may determine the temperature of the one or more sensors 106 based on the intensity of the ultraviolet light 101 measured by the one or more light sensors 106 and/or one or more electrical characteristics of the one or more light sensors 106. It is noted that various electrical characteristics of a diode detector, such as, but not limited to, forward voltage (e.g., forward voltage measured at a known current), may vary as a function of temperature. In this regard, the central controller 111 may correlate the measured electrical characteristic to the temperature of the one or more diode-based light sensors 106.

In another embodiment, the detector assembly 103 includes one or more dedicated temperature sensors. While the one or more temperature sensors are not depicted in FIGS. 1B-1C for purposes of clarity, the one or more temperature sensors may be positioned on or proximate to the one or more light sensors 106. For instance, in FIG. 1B, the one or more temperature sensors may be positioned adjacent to, under or on the top surface of the one or more light sensors 106. Further, the output of the one or more temperature sensors may be coupled to the one or more local controllers 110. It is noted herein that one or more dedicated temperature sensors may be used in the context of either the direct measurement approach or the indirect measurement approach of the present disclosure. The one or more temperature sensors may include any temperature sensor know in the art. For example, the one or more temperature sensors may include, but are not limited to, a RTD, a thermocouple device and the like.

In one embodiment, as shown in FIGS. 1B and 1C, a given local controller 110 is positioned proximate to the one or more light sensors 106 coupled to the given local controller 110. Such a configuration may be suitable for use in low temperature applications (e.g., applications less than 150° C.). In another embodiment, as shown in FIG. 1D, a given local controller 110 is positioned remotely from the one or more light sensors 106 coupled to the given local controller 110. In this embodiment, the given local controller 110 may be thermally isolated from the substrate. Such a configuration may be suitable for use in high temperature applications (e.g., greater than 150° C.) and serves to protect sensitive electronics in the local controller 110 from high temperatures. It is further noted that the one or more local controllers 110 may include any necessary electronic components known in the art of data processing and communication. Further, one or more batteries (not shown) may be housed within the one or more local controller 110 so as to protect the one or more batteries from high temperatures.

In another embodiment, as shown in FIGS. 1C and 1D, multiple light sensors 106 are coupled to a single local controller 110. In another embodiment, as shown in FIG. 1D, the measurement wafer device 100 includes multiple detector assemblies 103. In this regard, the measurement wafer device 100 may include multiple local controllers 110, with each local controller 110 being coupled to multiple light sensors 106. This arrangement forms a distributed network of light sensors 106 capable of monitoring the spatial and temporal dependence of light intensity and temperature across the wafer assembly 102.

In another embodiment, the one or more local controllers 110 are wirelessly communicatively coupled to the central controller 111. The one or more local controllers 110 may be wirelessly communicatively coupled to the central controller 111 in any suitable manner. For example, as shown in FIG. 1D, the measurement wafer device 100 includes a communication coil 120. In this regard, the one or more local controllers 110 are communicatively coupled to the communication coil (e.g., coupled via electrical interconnect 118). In turn, the communication coil 120 establishes a wireless communication link between the one or more local controllers 110 and the central controller 111. For instance, the communication coil 120 may establish a wireless communication link with the communication circuitry 122 of the central controller 111. In this regard, the communication coil 120 may be used to transmit one or more signals (e.g., RF signals) indicative of the intensity measurements and/or electrical characteristic measurements (and/or temperature measurements from dedicated temperature sensor) from the one or more light sensors 106. In turn, as previously noted, the central controller 111 may determine the temperature of the one or more light sensors 106 (which may be correlated to the corresponding position on the surface of the wafer assembly 102) based on one or more characteristics or features of the one or more electrical characteristics of the one or more light sensors 106 (and/or the temperature measurements from dedicated temperature sensor).

FIGS. 1E-1I illustrate various views of the measurement wafer device 100 for measuring UV light intensity and temperature via an indirect light intensity measurement, in accordance with one or more embodiments of the present disclosure. It is noted herein that the description of the components and embodiments illustrated in FIGS. 1A-1D should be interpreted to extend to FIGS. 1E-1I unless otherwise noted.

In one embodiment, the detector assembly 103 includes one or more photoluminescent (PL) elements 112. It is noted that the one or more PL elements 112 are suitable for absorbing at least UV light and, in response to UV absorption, emit at least visible light. Such a configuration allows for the use of light sensors that normally have less than desired sensitivity to UV light. In this regard, the one or more PL elements 112 of the detector assembly 103 may be used to convert at least some of the UV light incident on the PL elements 112 to visible light, which in some instances is more readily detected by certain sensor types (e.g., silicon diode detectors). For example, silicon diode detectors are commonly weakly sensitive to light having a wavelength below 350 nm.

In another embodiment, the detector assembly 103 determines the temperature of the one or more PL elements 112 based on an intensity feature of the intensity of the PL light measured by the one or more light sensors 106. For example, the intensity feature may include, but is not limited to, a decay feature (e.g., decay time) of the intensity of the PL light measured by the one or more light sensors 106. For instance, upon receiving the PL emission intensity data from the one or more local controllers 110, the central controller 111 may calculate the temperature corresponding with a given PL element 112 based on the decay time of the intensity of PL light measured from the given PL element 112. It is noted that such a decay-based measurement may require discontinuous excitation light (e.g., UV light), so as to allow for the proper characterization of the emission decay. It is noted herein that the exponential decay of the emission intensity from phosphors often displays strong temperature dependence. This effect is known as "phosphor thermometry." In this regard, one or more features/characteristics of the decay behavior of a given PL emission event of a PL element 112 may be used to calculate the temperature of the given PL element 112. For example, the decay time of the emission intensity of a given PL emission event of a PL element 112 may be used to calculate the temperature of the given PL element 112.

By way of another example, the intensity feature may include, but is not limited to, a ratio of the intensity of the PL light as measured by the one or more sensors to the intensity of PL measured at a known temperature. For instance, the calculation for the temperature of the PL element 112 may take the form:

$$T_m = \frac{I_m}{I_0} T_0$$

where $T_m$ represents the temperature being measured via the acquisition of the measurement intensity $I_m$, and $I_0$ represents the measured PL intensity acquired at a known temperature $T_0$ represents the known temperature.

For instance, upon receiving the PL emission intensity data from the one or more local controllers 110, the central controller 111 may calculate the temperature corresponding with a given PL element 112 based on the decay time of the intensity of PL light measured from the given PL element 112 or the calculated ratio of the measured PL light intensity to a PL light intensity measured at a known temperature for the given PL element 112.

A general description of phosphor thermometry is provided in "Thermographic Phosphors for High Temperature Measurements: Principles, Current State of the Art and Recent Applications" *Sensors* vol. 8, pp. 5673-5744 (2008), which is incorporated herein by reference in the entirety. In addition, the analysis of intensity-decay to determine temperature is described in U.S. Pat. No. 5,470,155 to Jensen, issued on Nov. 28, 2015; and U.S. Pat. No. 5,414,266 to Sun, issued on May 9, 2015, which are each incorporated herein by reference in the entirety.

The one or more PL elements 112 include any PL element known in the art. For example, the one or more PL elements 112 may be formed from, but are not limited to, a phosphor material or a blend of phosphor materials. In another embodiment, the one or more PL elements 112 are formed by forming a layer of phosphor and/or phosphor blend on a surface of a substrate. In another embodiment, the one or more PL elements 112 are formed by forming a layer of phosphor and/or phosphor blend on a surface of a portion of the substrate 107 of the wafer assembly 103.

It is noted herein the indirect light intensity/temperature measurement described herein may be implemented both in low and high temperature regimes. Referring now to FIG. 1E, in one embodiment, in the case of low temperature (e.g., less than 150° C.) applications, the one or more light sensors 106 and other additional electronic components (e.g., local controller) are located within the cavity 104 of the wafer assembly 102. In this regard, the one or more light sensors 106 and additional electronic components may be disposed on (or at least near) the substrate 107.

In one embodiment, the one or more PL elements 112 are affixed or positioned proximate to the one or more light sensors 106. The one or more PL elements may be disposed at the top surface of the one or more light sensors 106. Referring now to FIG. 1F, a sensor stack 119 is illustrated. For example, the sensor stack 119 includes a PL element 112 disposed on the top surface of a light sensor 106. Further, the sensor stack 119 is coupled to one or more local controllers (not shown in FIG. 1F) via an electrical interconnect 118. In this configuration, the one or more sensor stacks 119 may be arranged in a manner similar to the sensor arrangements described with respect to FIGS. 1A-1D, however, in this embodiment, the one or more sensors will detect light emitted from the PL elements 112. Then, the one or more local controllers 110 (or the central controller 111) may correlate the intensity of PL light from the PL elements 112 to the intensity of UV light impinging on the PL elements 112. In turn, the central controller 111 may then calculate the temperature of the one or more PL elements 112 based on an intensity feature of the PL light measured by the one or more light sensors 106.

In one embodiment, emission of the one or more PL elements 112 may be coupled to the one or more sensors 106 via free space coupling (not shown). In this regard, the light emitted by the one or more PL elements travels, in free space (or a selected atmosphere), to the one or more sensors 106.

Referring now to FIG. 1G, in one embodiment, in the case of high temperature (e.g., greater than 150° C.) applications, the one or more light sensors 106, the local controller 110 and/or other additional electronic components (e.g., battery) are housed in a sensor module 114. In one embodiment, the sensor module 114 is thermally isolated from the substrate 107 of the wafer assembly 102.

In one embodiment, the detector assembly 103 includes one or more light guiding elements 113 disposed within the one or more cavities 104. The one or more light guiding elements 113 are arranged to transmit light emitted by the one or more PL elements 112 to the one or more light sensors 106. In this regard, the emission of the one or more PL elements 112 is coupled to the one or more sensors 106 via one or more light guiding elements 113. For example, in the case of high temperature applications, visible light emitted by the one or more PL elements 112 may be transmitted along the one or more light guiding elements 113 to the one or more sensors 106 housed in the sensor module 114. Upon measurement of the visible light emitted by the one or more PL elements 112, the one or more local controllers 110 (or the central controller 111) may correlate the intensity of the visible PL light to the intensity of UV light impinging on the PL elements 112 (through opening(s) 108). The central controller 111 may then calculate the temperature of the one or more PL elements 112 based on an intensity feature of the intensity of the visible PL light measured by the one or more light sensors 106.

The one or more light guiding elements 113 may include any light guiding element known in the art. In one embodiment, the one or more light guiding elements 113 include an optical light guide. For example, the one or more light guiding elements 113 may include, but are not limited to, an optical light guide formed from glass, quartz, sapphire, acrylic and the like. By way of another example, the one or more light guiding elements 113 may include, but are not limited to, an optical fiber or an optical fiber bundle.

In another embodiment, the wafer assembly 102 is constructed such that the one or more cavities 104 consist of one or more channels that conform to the one or more light guiding elements 113. In another embodiment, as shown in FIG. 1G, the one or more light guiding elements 113 may provide mechanical support to the sensor module 114 so as to assist in securing the sensor module 114 above the top surface of the wafer assembly 102. It is noted that, in the case of a rigid light guide (e.g., glass, acrylic, quartz, sapphire rod), the light guiding element 113 is particularly useful for supplying mechanical support to the sensor module 114 due to the rigidity of the light guide and the low thermal conductivity.

In another embodiment, the detector assembly 103 includes one or more sensor filters (not shown). For example, a sensor filter may be positioned at the entrance of the one or more light sensors 106. For instance, a sensor filter may be positioned between the output of a given light guiding element 113 and the entrance to a corresponding light sensor 106. The one or more sensor filters may be selected so as to filter out undesired light from detection by the one or more light sensors 106. For example, the one or more sensor filters may include, but are not limited to, a filter capable of blocking excitation light (e.g., UV light) entering the wafer assembly cavity 102 via openings 108. In this regard, the one or more sensor filters may include, but are not limited to, one or more filters that selectively pass the PL emission (or a portion of the PL emission) from the one or more PL elements 112 to the one or more light sensors 106.

Referring now to FIGS. 1H and 1I, the detector assembly 103 includes multiple light guiding elements 113. For example, multiple light guiding elements 113 may serve to couple the PL emission from multiple PL elements 112 to multiple light sensors 106 housed within a single sensor module 114.

FIG. 1H illustrates a cross-sectional view of the measurement wafer device 100 with multiple light guiding elements 113 coupling the output of one or more PL elements 112 to the multiple sensors 106. In this embodiment, each PL element 112 is coupled to a single light sensor 106. In another embodiment, multiple PL elements 112 are coupled to a single light sensor 106.

Further, the multiple light guiding elements 113 serve to elevate the sensor module 114 from the wafer assembly 102.

FIG. 1I illustrates top view of the substrate 107 of the wafer assembly 102 of the measurement wafer device 100 with multiple light guiding elements 113 coupling the output of one or more PL elements 112 to the multiple sensors 106, in accordance with one embodiment of the present disclosure. It is noted that the cover 105 is not depicted in FIG. 1I for purposes of clarity. In one embodiment, multiple PL elements 112 (e.g., phosphor dots) are distributed across the substrate 107 of the wafer assembly 102. Further, the device 100 includes multiple sensor modules 114. Each of the multiple sensor modules 114 includes one or more light sensors 106 (not shown in FIG. 1I) and one or more local controllers 110 (and/or other electronic components (e.g., processor(s), memory, battery and the like)). In this regard, a set of light guiding elements 113 serve to transmit light (e.g., visible light) from each of a group of PL elements 112 to the associated sensor module 114.

While cover 105 is not depicted in FIG. 1I for purposes of clarity, it is further noted that the PL elements 112 distributed across the substrate 107 may be covered by windows 116 disposed on/in the cover 105 that sits above the substrate. In this regard, the cover 105 may have a window pattern that corresponds to the pattern of PL elements 112 distributed across the substrate 107.

As noted previously, the measurement wafer device also includes one or more communication coils 120 suitable for establishing a communication link between the sensor modules 114 and the central controller 111 (e.g., communication circuitry 122 of central controller 111).

It is noted herein that, while the present disclosure has focused on the temperature determination being carried out by the central controller 111, this is not a limitation on the present disclosure. It is recognized herein that the temperature calculation of the present disclosure may be carried out on the one or more local controllers 110 (or any additional controller or processing element). In general, it is noted that the various data processing steps (or portions of the various data processing steps) of the present disclosure may be carried out on either the one or more local controllers 110 or the central controller 111.

FIG. 2 is a flowchart depicting the method 200 of measuring radiation intensity and temperature across the measurement wafer 100, in accordance with one embodiment of the present disclosure. It is noted herein that the steps of flow chart 200 are not to be interpreted as limiting and are provided merely for illustrative purposes.

In one embodiment, the process starts at step 202. In step 204, the process includes measuring the intensity of UV light at an ith sensor of the one or more sensors 106. For example, UV light intensity may be measured directly (e.g., UV light passed through openings 108 is measured by sensors 106) or indirectly (e.g., visible PL light emitted in response to UV light absorption is measured by sensors 106). Then, in step 206, after the light intensity is measured for the ith sensor, the result is stored in memory (e.g., memory of local controller 110). In step 208, if the ith sensor is not last sensor of the one or more sensors 106 then the NO branch is taken and steps 204, 206 are repeated. In the case where the ith sensor is the last sensor of the one or more light sensors 106 then the YES branch is taken and the process moves to step 210.

In step 210, the measurement data acquired and stored from the N sensors (e.g., stored in one or more local controllers 110) is transmitted to the central controller 111.

In step 212, the temperature is calculated for the ith sensor of the one or more sensors 106. For example, the temperature associated with the ith sensor may be calculated based on an intensity feature of the measured intensity (e.g., decay time of visible intensity in case of indirect measurement). By way of another example, the temperature associated with the ith sensor may be calculated based on one or more measured electrical characteristics of the one or more sensors 106 (e.g., forward voltage of the one or more sensors). By way of another example, the temperature associated with the ith sensor may be measured using a dedicated ith temperature sensor.

In step 214, if the ith sensor is not last sensor of the one or more sensors 106 then the NO branch is taken and step 212 is repeated. In the case where the ith sensor is the last sensor of the one or more light sensors 106 then the YES branch is taken and the process moves to step 216.

In step 216, the intensity and/or temperature results for each of the N sensors is mapped to the surface of the wafer assembly 102. For example, the central controller 111 (or another controller) may correlate the intensity and/or temperature measured for each sensor of the one or more sensors 106. Then, based on the known position of each of the light sensors 106 (or the position of each of the PL elements 112 in the case of the indirect measurement approach) the central control 111 can form a database and/or map of the intensity and/or temperature at the top surface of the wafer assembly 102 as a function of position in the plane of the top surface (e.g., X-Y position) of the wafer assembly 102. In another embodiment, the database and/or map of the intensity and/or temperature is presented on a display of a user interface (not shown).

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A measurement wafer apparatus for measuring radiation intensity and temperature comprising:
    a wafer assembly including one or more cavities; and
    a detector assembly, at least a portion of the detector assembly disposed within the one or more cavities of the wafer assembly, the detector assembly including one or more light sensors, the detector assembly configured to perform at least one of a direct measurement of the intensity of ultraviolet light from a process environment incident on at least one surface of the wafer assembly or an indirect measurement of the intensity of ultraviolet light from the process environment incident on the at least one surface of the wafer assembly, wherein the detector assembly is further configured to determine a temperature of one or more portions of the wafer assembly based on one or more characteristics of the one or more light sensors upon measuring the intensity of the ultraviolet light from the process environment incident on the at least one surface of the wafer assembly.

2. The apparatus of claim 1, wherein the wafer assembly comprises:
    a substrate; and
    a cover operably coupled to a portion of the substrate.

3. The apparatus of claim 1, wherein the detector assembly includes:
    one or more photoluminescent elements configured to convert ultraviolet light to visible light, wherein the one or more light sensors are configured to perform an indirect measurement of the intensity of ultraviolet light incident on the one or more photoluminescent elements by measuring the intensity of visible light emitted by the one or more photoluminescent elements.

4. The apparatus of claim 3, wherein the detector assembly includes:
    one or more light guiding elements disposed within the one or more cavities, wherein the one or more light guiding elements are configured to transmit visible light emitted by the one or more photoluminescence elements to the one or more light sensors.

5. The apparatus of claim 1, wherein the one or more light sensors are configured to perform a direct measurement of the intensity of ultraviolet light incident on the one or more light sensors.

6. The apparatus of claim 1, wherein the one or more characteristics of the one or more light sensors comprise:
    at least one of an electrical characteristic or an intensity characteristic of the one or more light sensors.

7. The apparatus of claim 6, wherein the electrical characteristic comprises:
    a forward voltage across the one or more light sensors measured at a known current.

8. The apparatus of claim 6, wherein the intensity characteristic comprises:
    an intensity characteristic of visible light incident on the one or more light sensors in response to the excitation of one or more photoluminescence elements by the ultraviolet light.

9. The apparatus of claim 1, wherein the detector assembly comprises:
    a local controller configured to receive one or more signals from the one or more light sensors indicative of at least one of the intensity of ultraviolet light incident on at least one of the one or more light sensors or one or more photoluminescent elements or an electrical characteristic of the one or more light sensors; and
    a central controller communicatively coupled to the local controller and configured to determine a temperature of the one or more portions of the wafer assembly based on at least one of the intensity of ultraviolet light incident on at least one of the one or more light sensors or one or more photoluminescent elements or an electrical characteristic of the one or more light sensors.

10. The apparatus of claim 1, wherein the wafer assembly includes one or more openings at the at least one surface of the wafer assembly configured to pass ultraviolet light incident on the at least one surface of the wafer assembly to the one or more light sensors of the detector assembly.

11. The apparatus of claim 10, wherein the wafer assembly includes one or more windows positioned at the one or more openings at the at least one surface of the wafer assembly and configured to transmit ultraviolet light incident on the at least one surface of the wafer assembly to the one or more light sensors of the detector assembly.

12. The apparatus of claim 11, wherein the wafer assembly includes one or more entrance filters disposed at least proximate to the one or more windows and configured to block a selected portion of light incident on the at least one surface of the wafer assembly.

13. The apparatus of claim 1, wherein the one or more light sensors comprise:
    one or more diode detectors.

14. The apparatus of claim 13, wherein the one or more diode detectors comprise:
    at least one of a silicon carbide detector, gallium nitride diode detector, aluminum gallium nitride detector or a silicon detector.

15. The apparatus of claim 14, wherein the one or more light sensors and the one or more local controllers are disposed within the cavity between the substrate and the cover.

16. A measurement wafer apparatus for measuring radiation intensity and temperature comprising:
    a wafer assembly including one or more cavities; and
    a detector assembly, at least a portion of the detector assembly disposed within the one or more cavities of the wafer assembly, the detector assembly including one or more light sensors, the detector assembly configured to perform at least one of a direct measurement of the intensity of ultraviolet light from a process environment incident on at least one surface of the wafer assembly or an indirect measurement of the intensity of ultraviolet light from the process environment incident on the at least one surface of the wafer assembly, wherein the detector assembly is further configured to determine a temperature of one or more portions of the wafer assembly based on at least one of one or more characteristics of the one or more light sensors or one or more temperature measurements from one or more temperature sensors disposed at least proximate to the one or more light sensors.

17. A measurement wafer apparatus for measuring radiation intensity and temperature comprising:
    a substrate;
    a cover operably coupled to a portion of the substrate;

one or more cavities formed between the substrate and the cover;

a detector assembly including one or more light sensors disposed within the one or more cavities, wherein the cover includes one or more openings for passing light to the one or more light sensors from a top surface of the cover, wherein the one or more light sensors are configured to measure the intensity of light from a process environment passed through the one or more openings; and one or more local controllers communicatively coupled to the one or more light sensors, the one or more local controllers configured to receive one or more signals indicative of at least one of the intensity of light measured by the one or more light sensors or one or more additional characteristics of the one or more light sensors.

18. The apparatus of claim 17, wherein the one or more light sensors are configured to directly measure the intensity of light passed through the one or more openings.

19. The apparatus of claim 17, further comprising:
one or more central controllers communicatively coupled to the one or more local controllers and configured to determine the temperature of the one or more light sensors based on the one or more additional characteristics of the one or more light sensors.

20. The apparatus of claim 19, wherein the one or more additional characteristics comprise:
one or more electrical characteristics of the one or more light sensors.

21. The apparatus of claim 20, wherein the one or more electrical characteristics comprise:
a forward voltage measured at a known current.

22. The apparatus of claim 17, wherein the one or more central controllers are wirelessly communicatively coupled to the one or more local controllers.

23. The apparatus of claim 17, wherein the detector assembly includes:
one or more window filters disposed at least proximate to the one or more openings and configured to transmit light from the top surface of the cover to the one or more light sensors.

24. The apparatus of claim 23, wherein the detector assembly includes:
one or more entrance filters disposed at least proximate to the one or more windows and configured to block a portion of light incident on the one or more windows.

25. The apparatus of claim 17, wherein the one or more light sensors are disposed proximate to the one or more local controllers.

26. The apparatus of claim 17, wherein the one or more light sensors are disposed remotely from the one or more local controllers, wherein the one or more local controllers are substantially thermally isolated from the substrate.

27. The apparatus of claim 17, wherein the one or more light sensors comprise:
one or more diode detectors.

28. The apparatus of claim 27, wherein the one or more diode detectors comprise:
at least one of a silicon carbide detector, gallium nitride diode detector, aluminum gallium nitride detector or a silicon detector.

29. A measurement wafer apparatus for measuring radiation intensity and temperature comprising:
a wafer assembly including a substrate and a cover operably coupled to a portion of the substrate;
a detector assembly, the detector assembly including:

one or more light sensors disposed within one or more cavities formed between the substrate and the cover;

one or more photoluminescent elements disposed within the one or more cavities, wherein the cover includes one or more openings for passing light to the one or more photoluminescent elements from a top surface of the cover, wherein the one or more photoluminescent elements are configured to absorb at least a portion of light of a first wavelength range passed through the one or more openings and emit light of at least a second wavelength range different from the first wavelength range, wherein the one or more light sensors are configured to measure the intensity of light of the at least a second wavelength range emitted by the one or more photoluminescent elements; and one or more local controllers communicatively coupled to the one or more light sensors, the one or more local controllers configured receive one or more signals indicative of the intensity of the light of the at least a second wavelength range measured by the one or more light sensors; and one or more central controllers communicatively coupled to the one or more local controllers, the one or more central controllers configured to determine the temperature of the one or more photoluminescent elements based on an intensity feature of the intensity of the light of the at least a second wavelength range measured by the one or more light sensors.

30. The apparatus of claim 29, wherein the one or more light sensors are configured to indirectly measure the intensity of light passed through the one or more openings.

31. The apparatus of claim 29, wherein the intensity feature of the intensity of the light of the at least a second wavelength comprises:
a decay time of the intensity of the light of the at least a second wavelength range.

32. The apparatus of claim 29, wherein the intensity feature of the intensity of the light of the at least a second wavelength range comprises:
a ratio of a first intensity value of the light of the at least a second wavelength to a second intensity value of the light of the at least a second wavelength, wherein the second intensity value is measured at a known temperature.

33. The apparatus of claim 29, wherein the one or more central controllers are wirelessly communicatively coupled to the one or more local controllers.

34. The apparatus of claim 29, wherein the one or more local controllers include one or more processors configured to execute a set of program instructions, the set of program instructions configured to cause the one or more processors to receive one or more signals indicative of the intensity of the light of the at least a second wavelength measured by the one or more light sensors.

35. The apparatus of claim 29, wherein the one or more central controllers include one or more processors configured to execute a set of program instructions, the set of program instructions configured to cause the one or more processors to determine the temperature of the one or more photoluminescent elements based on the intensity feature of the intensity of the light of the at least a second wavelength range measured by the one or more light sensors.

36. The apparatus of claim 29, wherein the detector assembly includes one or more light guiding elements disposed within the one or more cavities, wherein the one or more light guiding elements are configured to transmit light of the at least a second wavelength range from the one or more photoluminescence elements to the one or more light sensors.

37. The apparatus of claim 36, wherein the one or more light guiding elements comprise:
   one or more light guides.

38. The apparatus of claim 36, wherein the one or more light guiding elements comprise:
   one or more optical fibers.

39. The apparatus of claim 36, wherein the one or more light guiding elements comprise:
   two or more light guiding elements.

40. The apparatus of claim 39, wherein the two or more light guiding elements comprise:
   a first light guiding element; and
   at least a second light guiding element,
   wherein the first light guiding element is configured to transmit light of the at least a second wavelength range from a first photoluminescence element to a first light sensor,
   wherein the at least a second light guiding element is configured to transmit light of the at least a second wavelength range from at least a second photoluminescence element to at least a second light sensor.

41. The apparatus of claim 39, wherein the two or more light guiding elements comprise:
   a first light guiding element; and
   at least a second light guiding element, wherein the first light guiding element is configured to transmit light of the at least a second wavelength range from a first photoluminescence element to a first light sensor, wherein the at least a second light guiding element is configured to transmit light of the at least a second wavelength range from at least a second photoluminescence element to a first light sensor.

42. The apparatus of claim 29, wherein the one or more photoluminescent elements comprise:
   one or more photoluminescent elements configured to absorb at least ultraviolet light and further configured to emit at least visible light in response to absorbed ultraviolet light.

43. The apparatus of claim 29, wherein the one or more photoluminescent elements comprise:
   one or more photoluminescent layers including at least one of phosphor or a phosphor blend.

44. The apparatus of claim 29, wherein the detector assembly includes:
   one or more windows filters disposed at least proximate to the one or more openings and configured to transmit light from the top surface of the cover to the one or more light sensors.

45. The apparatus of claim 44, wherein the detector assembly includes:
   one or more entrance filters disposed at least proximate to the one or more windows and configured to block a portion of light having a wavelength outside of the first wavelength range.

46. The apparatus of claim 29, wherein the detector assembly includes:
   one or more sensor filters disposed at least proximate to the one or more sensors and configured to block a portion of light a wavelength outside of the first wavelength and further configured to transmit at least a portion of light of the at least a second wavelength range.

47. The apparatus of claim 29, wherein the one or more light sensors and the one or more local controllers are disposed within the cavity between the substrate and the cover.

48. The apparatus of claim 29, wherein the one or more light sensors and the one or more local controllers are disposed within a sensor module.

49. The apparatus of claim 48, wherein the sensor module is substantially thermally isolated from the substrate.

50. The apparatus of claim 29, wherein the one or more light sensors comprise:
   two or more light sensors distributed across the wafer substrate.

51. The apparatus of claim 50, wherein the one or more openings comprise:
   two or more openings distributed across the cover, wherein the two or more windows substantially align with the two or more light sensors.

52. A measurement wafer apparatus for measuring radiation intensity comprising:
   a wafer assembly; and
   a detector assembly, at least a portion of the detector assembly disposed on a surface of the wafer assembly, the detector assembly including one or more light sensors, the detector assembly configured to perform at least one of a direct measurement of the intensity of ultraviolet light from a process environment incident on at least one surface of the wafer assembly or an indirect measurement of the intensity of ultraviolet light from the process environment incident on the at least one surface of the wafer assembly.

* * * * *